United States Patent [19]

Tezuka

[11] Patent Number: 4,644,183
[45] Date of Patent: Feb. 17, 1987

[54] PULSE GENERATOR CIRCUIT

[75] Inventor: Hideharu Tezuka, Yokosuka, Japan

[73] Assignee: Kabushiki Kaisha Toshiba, Kawasaki, Japan

[21] Appl. No.: 625,125

[22] Filed: Jun. 27, 1984

[30] Foreign Application Priority Data

Jun. 29, 1983 [JP] Japan .................. 58-117465

[51] Int. Cl.⁴ .......................... H03K 3/00; H03K 5/01
[52] U.S. Cl. .................... 307/268; 307/246; 307/260; 307/265
[58] Field of Search ............... 328/59, 60, 61, 67; 307/260, 265, 266, 268, 246, 234

[56] References Cited

U.S. PATENT DOCUMENTS 3,801,828 4/1974 Lynn et al. ..................... 307/265
4,185,321 1/1980 Iwahashi et al. ............... 365/204

FOREIGN PATENT DOCUMENTS 2039732 2/1972 Fed. Rep. of Germany .
106240 5/1974 German Democratic Rep. .
2059708 4/1981 United Kingdom .

OTHER PUBLICATIONS

"A Transistorized Shaper that Produces Start-Stop Pulses," Belov et al., 1973 from *Pribory i Tekhnika Eksperimenta*, No. 6, pp. 84-86.

Primary Examiner—Stanley D. Miller
Assistant Examiner—M. R. Wambach
Attorney, Agent, or Firm—Finnegan, Henderson, Farabow, Garrett & Dunner

[57] ABSTRACT

A pulse generator circuit includes first and second capacitors, first and second switches connected in parallel with each other, an inverter circuit for inverting an input signal, first switch control circuit for charging the first capacitor in response to a high level output signal from the inverter circuit, discharging the first capacitor with a predetermined time constant in response to a low level output signal, and respectively setting the first switch to a conductive or nonconductive state in response to a voltage across the first capacitor whose level is higher or lower than the predetermined voltage level, and second switch control circuit for charging the second capacitor in response to high level input signal, discharging the second capacitor at a predetermined time constant in response to a low level input signal, and respectively setting the second switch to a conductive or nonconductive state in response to a voltage across the second capacitor whose level is higher or lower than a predetermined voltage level.

16 Claims, 10 Drawing Figures

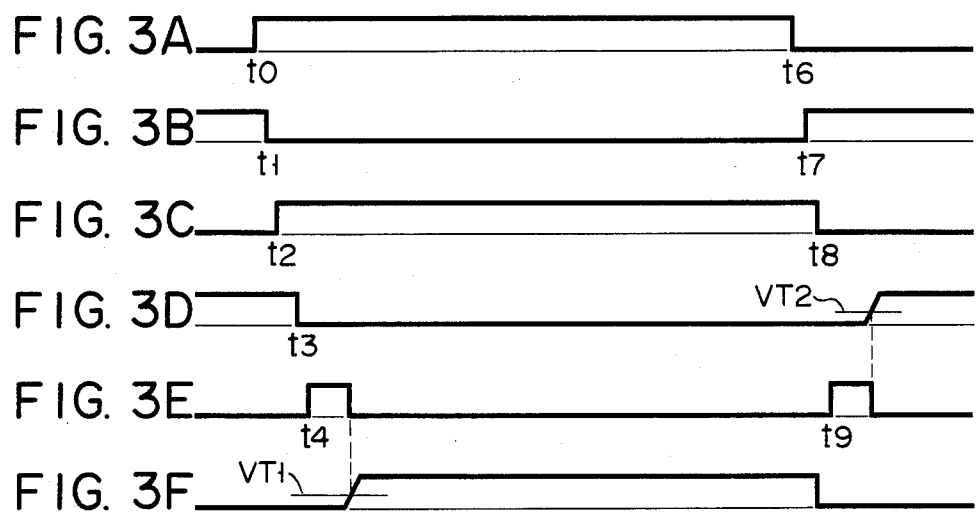
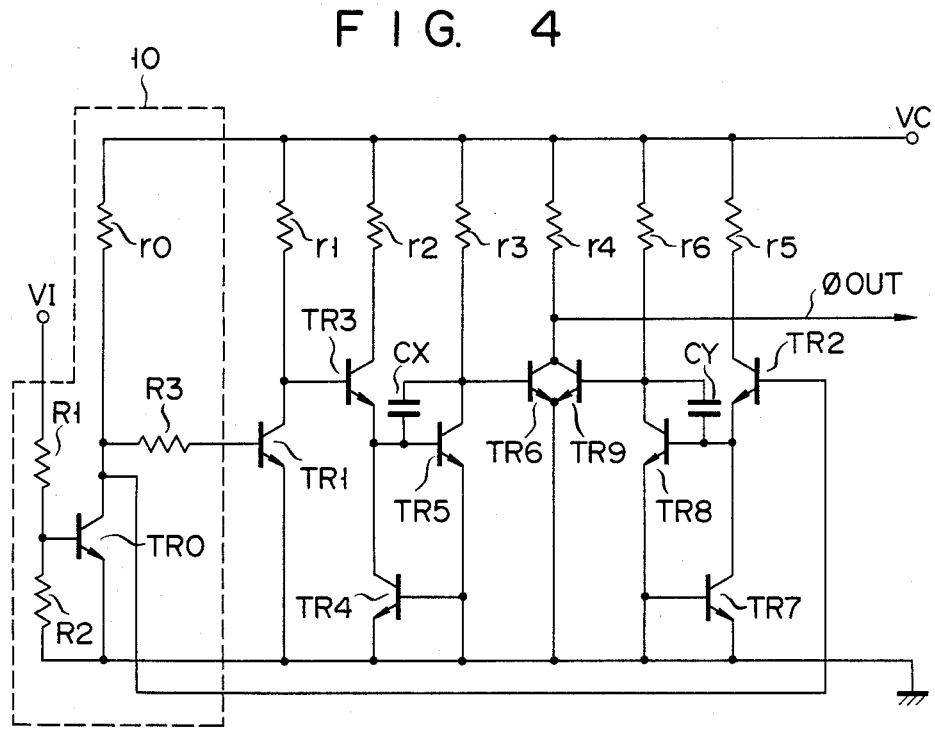

F I G. 5
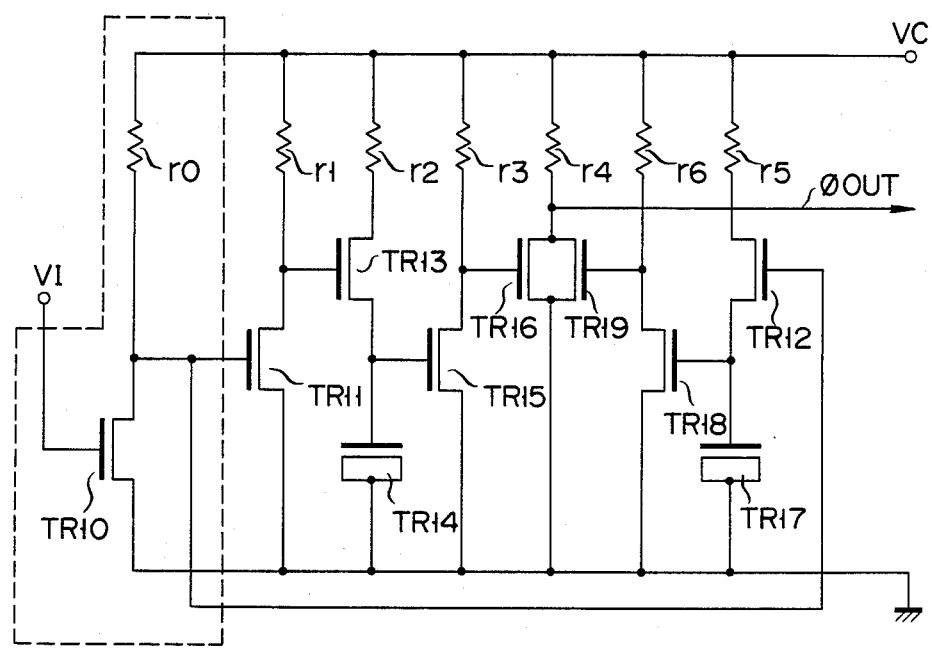

PULSE GENERATOR CIRCUIT

BACKGROUND OF THE INVENTION

The present invention relates to a pulse generator circuit for generating pulse signals capable of being used as set signals and reset signals to be supplied, for example, to a flip-flop circuit.

In a semiconductor integrated circuit device, a pulse generator circuit for generating a set signal and a reset signal for a RS flip-flop is generally composed as shown in FIG. 1. This pulse generator circuit has capacitors C1 and C2 respectively coupled between the input/output pins 2A and 2B as well as 2C and 2D of the semiconductor integrated circuit device, and a charge/discharge circuit formed in the semiconductor integrated circuit device for charging/discharging these capacitors C1 and C2. This charge/discharge circuit charges these capacitors C1 and C2, and then discharges the capacitors C1 and C2 at a predetermined timing, thereby generating pulses.

However, it is necessary to externally attach capacitors C1 and C2 having relatively large capacitances so as to compose a pulse generator circuit shown in FIG. 1, thereby complicating the fabricating steps of this pulse generator and increasing the cost. As a semiconductor integrated circuit is highly integrated, the number of input/output pins has a tendency to increase, and it is desired to reduce the number of the input/output pins exclusively for the pulse generator. If the capacitors C1 and C2 are formed in the semiconductor integrated circuit, it is not necessary to provide the input/output pins exclusively for the pulse generator. However, since these capacitors C1 and C2 have relatively large capacitances, a considerably large pattern area is needed when the capacitors C1 and C2 are formed in the semiconductor integrated circuit, resulting in the disturbance of the high integration.

SUMMARY OF THE INVENTION

It is an object of the present invention to provide a pulse generator circuit capable of being highly integrated without using externally attached capacitors.

In order to achieve the above object, there is provided according to the present invention a pulse generator circuit comprising first and second switching circuits coupled in parallel with one another, a signal level converter circuit for shifting the level of an input signal between the first level and the second level; first and second capacitors; a first switch control circuit for charging the first capacitor in response to the input signal of the first level, discharging the first capacitor in response to the input signal of the second level at a predetermined time constant, and setting the first switching circuit to conductive and nonconductive states respectively when the voltage across the first capacitor is higher and lower than a predetermined level; and a second switch control circuit for charging the second capacitor in response to the output signal of the first level from the signal level converter circuit, discharging the second capacitor in response to the output signal of the second level at a predetermined time constant, and setting the second switching circuit to conductive and nonconductive states respectively when the voltage across the second capacitor is higher and lower than a predetermined level.

Since the change of the switching position of the first or second switching circuit to the conductive state is delayed by the discharging characteristic of the first or second capacitor when the input signal changed from the first level to the second level or vice versa to generate the pulse in the present invention, it is not necessary to use the capacitors with a large capacitance as the first and second capacitors, thereby improving the integration.

BRIEF DESCRIPTION OF THE DRAWINGS

FIGS. 3A to 3F are signal waveform diagrams for describing the operation of the pulse generator circuit shown in FIG. 2;

FIG. 4 is a circuit diagram of a pulse generator circuit in which capacitors are added to the circuit shown in FIG. 2; and FIG. 5 is a circuit diagram of a pulse generator circuit using MOS transistors instead of bipolar transistors in FIG. 2.

DETAILED DESCRIPTION OF THE PREFERRED EMBODIMENTS

Figure 1:
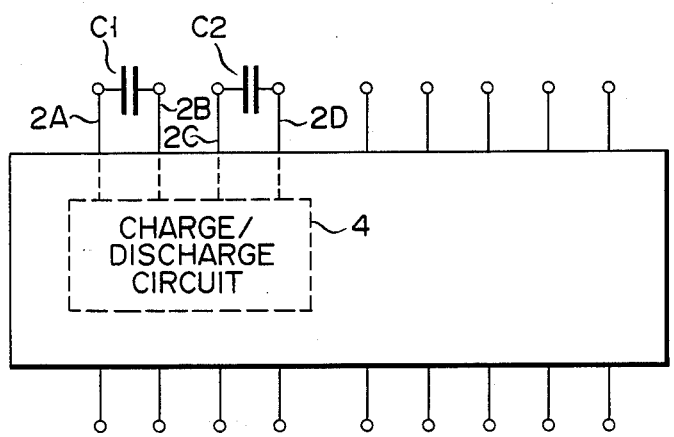
FIG. 1 is a schematic view of a semiconductor integrated circuit having a conventional pulse generator circuit.
Figure 2:
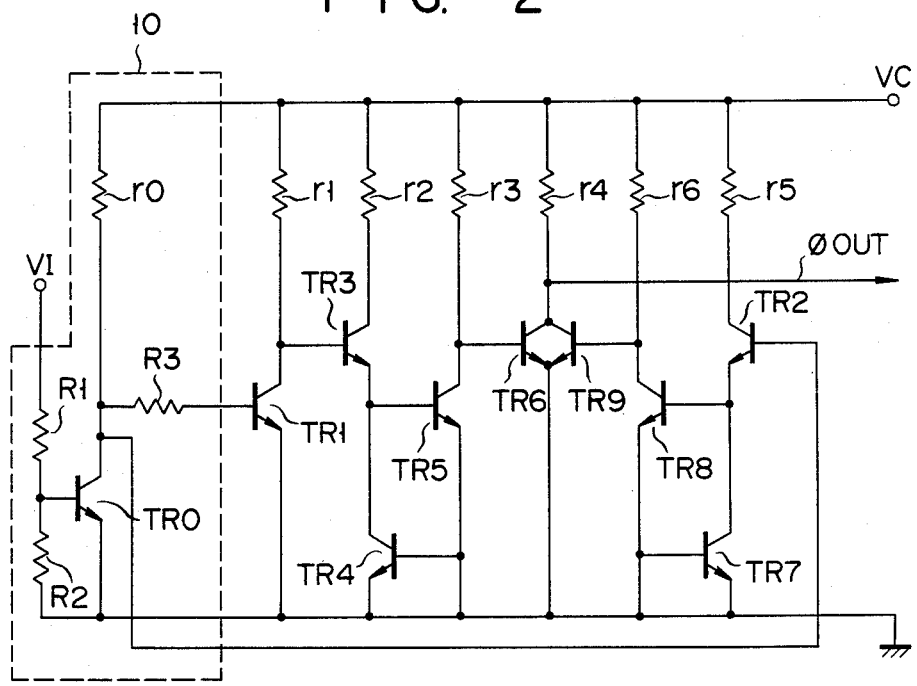
FIG. 2 is a circuit diagram of a pulse generator circuit according to an embodiment of the present invention.

FIG. 2 shows a pulse generator circuit according to an embodiment of the present invention. This pulse generator circuit has a waveform shaper circuit 10 for shaping the waveform of an input signal supplied to an input terminal VI, and has transistors TR1 and TR2 which receive at the bases the first and second output voltages from the waveform shaper circuit 10.

This waveform shaper 10 has resistors R1 and R2 coupled in series between the input terminal VI and the ground, a transistor TR0 connected at the base to the junction between the resistors R1 and R2, connected at the collector through a load resistor r0 to a power source terminal VC and grounded at the emitter, and a resistor R3 connected between the collector of the transistor TR0 and the base of the transistor TR1. Further, the collector of this transistor TR0 is connected to the base of the transistor TR2.

The collector of the transistor TR1 is connected through a load resistor r1 to the power source terminal VC, connected to the base of a transistor TR3, and the emitter is grounded. The collector of the transistor TR3 is connected through a load resistor r2 to the power source terminal VC, and the emitter is connected to the base of a transistor TR5 and grounded through the collector-emitter path of a transistor TR4. The collector of the transistor TR5 is connected through a load resistor r3 to the power source terminal and connected to the base of a transistor TR6, and the emitter is grounded. The collector of the transistor TR6 is connected through a load resistor r4 to the power source terminal, and the emitter is grounded.

The collector of the transistor TR2 is connected through a load resistor r5 to the power source terminal VC, and the emitter is connected to the base of a transistor TR8 and grounded through the collector-emitter path of a transistor TR7. The collector of this transistor TR8 is connected through a load resistor r6 to the power source terminal VC and connected to the base of a transistor TR9, and the emitter is grounded. The emitter-collector path of the transistor TR9 is connected in parallel with the emitter-collector path of the transistor TR6. The transistors TR1 to TR9 shown in FIG. 2 are all npn type.

An operation of the pulse generator circuit shown in FIG. 2 will be described with reference to the signal waveforms shown in FIGS. 3A to 3F.

As shown in FIG. 3A, when an input signal $\phi$IN to be applied to the input terminal VI becomes high at a time t0, the transistor TR0 is rendered conductive, and the collector voltage of the transistor TR0 becomes low at a time t1 which is slightly delayed from the rise of the input signal $\phi$IN shown in FIG. 3B. Thus, the transistors TR1 and TR2 become nonconductive, and the collector voltage of the transistor TR1 becomes high at a time t2, with a slight delay time from the time t1 as shown in FIG. 3C. As a result, the transistors TR3 and TR5 are sequentially made conductive, and the collector voltage of the transistor TR5 becomes low after the time required to conduct these transistors TR3 and TR5 has elapsed from the time t2, i.e., at a time t3 as shown in FIG. 3D. Thus, the transistor TR6 becomes nonconductive, and the output signal $\phi$OUT rises to a high level at a time t4, as shown in FIG. 3E. In this case, the capacitor formed between the collector and the base of the transistor TR4 is charged through the load resistor r2 and the transistor TR3.

On the other hand, the transistors TR2 and TR8 are in a conductive state before the time t1, and the capacitor formed between the collector and the base of the transistor TR7 is charged through the load resistor r5 and the transistor TR2. When the collector voltage of the transistor TR0 becomes low at the time t0, the transistor TR2 becomes nonconductive at the time t1. However, in this case, the transistor TR8 is held in the conductive state for a predetermined period of time by the charging voltage of the capacitor between the collector and the base of the transistor TR7 and gradually comes to be in a nonconductive state after the predetermined time has elapsed from the time t1. When this transistor TR8 gradually becomes nonconductive, the collector voltage of the transistor TR8 gradually becomes high as shown in FIG. 3F. When the collector voltage of the transistor TR8 reaches a predetermined level VT1, the transistor TR9 is made conductive, and the output signal $\phi$OUT becomes low.

Then, assuming that the input signal $\phi$IN becomes low at a time t6, as shown in FIG. 3A, the transistor TR0 becomes nonconductive, and the collector voltage of the transistor TR0 becomes high at a time t7, as shown in FIG. 3B. Thus, the transistors TR1, TR2 and TR8 are conducted in the same manner as described above, and the collector voltage of the transistor TR1 becomes a low level voltage at a time t8, as shown in FIG. 3C. Therefore, the transistor TR3 becomes nonconductive. In this case, the transistor TR5 is maintained in the conductive state by the charging voltage of the capacitor between the base and the collector of the transistor TR4, thereby maintaining the transistor TR6 in the nonconductive state. Since the transistor TR8 is made conductive, the transistor TR9 becomes nonconductive, and the collector voltage of the transistor TR9 becomes low at a time t8, as shown in FIG. 3F, and the output signal $\phi$OUT becomes high at a time t9, as shown in FIG. 3E. Subsequently, the charging voltage of the capacitor between the collector and the base of the transistor TR4 gradually decreases, and when the charging voltage of the capacitor between the collector and the base of the transistor TR4 becomes a voltage lower than a predetermined value, the transistor TR5 gradually becomes nonconductive, and the collector voltage of the transistor TR5 gradually becomes high. When the collector voltage of the transistor TR5 becomes higher than a predetermined level VT2, the transistor TR6 is made conductive. Consequently, the output signal $\phi$OUT becomes low.

In this manner, when the input signal $\phi$IN alters from the low level to the high level, the transistor TR8 is shifted from the conductive state to the nonconductive state with a predetermined delay time by the charging characteristic of the capacitor between the base and the collector of the transistor TR7, thereby generating a leading pulse. When the input signal $\phi$IN alters from the high level to the low level, the transistor TR5 is shifted from the conductive state to the nonconductive state in a predetermined delay time by the charging characteristic of the capacitor between the base and the collector of the transistor TR4, thereby generating a trailing pulse.

As described above, in the circuit shown in FIG. 2, the output signal $\phi$OUT can be generated in response to the rise and fall of the input signal $\phi$IN without using the capacitor of large capacitance.

FIG. 4 shows a pulse generator circuit according to another embodiment of the present invention. This pulse generator circuit is composed substantially in the same manner as the pulse generator circuit shown in FIG. 2 except that capacitors CX and CY are respectively coupled between the bases and the collectors of the transistors TR5 and TR8. The length of time when the transistors TR5 and TR8 are shifted from the conductive state to the nonconductive state can be arbitrarily set by suitably setting the capacitances of the capacitors CX and CY. In this case, the capacitances of the capacitors CX and CY are not necessarily required to be excessively large, but the capacitors CX and CY can be formed in a small occupying area and do not adversely influence the integration of the embodiment of this pulse generator circuit.

FIG. 5 shows a pulse generator circuit according to still another embodiment of the present invention. This pulse generator circuit is composed substantially in the same manner as the pulse generator circuit shown in FIG. 2 except that MOS transistors TR10 to TR19 are respectively employed instead of the transistors TR0 to TR9 in FIG. 2. Similar advantages to those in the generator circuit in FIG. 2 can be achieved even in the embodiment of this pulse generator circuit.

What is claimed is:

1. A pulse generator circuit comprising:
input terminal means for receiving an input signal having first and second levels and for supplying from said input signal the inverse of said input signal wherein said first and second levels of the input signal are shifted to the second and first levels, respectively;
an output terminal;
first and second power source terminals;
load means;
first and second switching means, each having two terminals and each of said switching means being connected at one terminal thereof both to said output terminal and to said first power source terminal through said load means and at the other terminal thereof to said second power source terminal, for selectively connecting said output terminal to either said first power source terminal through said load means or to said second power source terminal;

first and second capacitive means;

first switch circuit means, including a first switch connected between said first power source terminal and said first capacitive means and having a control terminal coupled to said input terminal means to receive said input signal, said first switch having conductive and nonconductive states set in response to said first and second levels of said input signal, respectively, for permitting said first capacitive means to be charged when said first switch is set in said conductive state, and further including a first transistor connected at the base and the emitter thereof across said first capacitive means, and at the collector thereof to both said first switching means and said first power source terminal, for permitting said first capacitive means to be discharged through the base-emitter path of said first transistor when said first switch is set nonconductive;

second switch circuit means, including a second switch connected between said first power source terminal and said second capacitive means and having a control terminal coupled to said input terminal means to receive said inverse of said input signal, said second switch having conductive and nonconductive states set in response to said first and second levels of said inverse of said input signal, respectively, for permitting said second capacitive means to be charged when said second switch circuit is set in said conductive state, and further including a second transistor connected at the base and the emitter thereof across said second capacitive means, and at the collector thereof to both said second switching means and said first power source terminal, for permitting said second capacitive means to be discharged through the base-emitter path of said second transistor when said second switch is set nonconductive; and wherein each of said first and second switching means is set to conductive and nonconductive states, when the voltage across each of said first and second capacitive means is higher and lower than a predetermined level, respectively.

2. A pulse generator circuit according to claim 1, wherein said input terminal means includes an inverter circuit for inverting said input signal.

3. A pulse generator circuit according to claim 2, wherein said first capacitive means comprises a third transistor connected at the collector thereof to the base of said first transistor and connected at the base and emitter thereof to the emitter of said first transistor.

4. A pulse generator circuit according to claim 3, wherein said first switch comprises a transistor connected at the emitter thereof to the collector of said third transistor and connected at the collector thereof to said first power source terminal.

5. A pulse generator circuit according to claim 3, further comprising a capacitor connected between the base and the collector of said first transistor.

6. A pulse generator circuit according to claim 2, further comprising a first capacitor connected between the base and the collector of said first transistor, and a second capacitor connected between the base and collector of said second transistor.

7. A pulse generator circuit according to claim 6, wherein said second capacitive means comprises a fourth transistor connected at the collector thereof to the base of said second transistor and connected at the base and emitter thereof to the emitter of said second transistor.

8. A pulse generator circuit according to claim 7, wherein said second switch comprises a transistor connected at the emitter thereof to the collector of said fourth transistor and connected at the collector thereof to said first power source terminal.

9. A pulse generator circuit according to claim 8, wherein said first and second switching means are formed of fifth and sixth transistors connected in the emitter-collector paths thereof in parallel with each other and respectively connected at the bases thereof to the collectors of said first and second transistors.

10. A pulse generator circuit according to claim 7, wherein said first and second switching means are formed of fifth and sixth transistors connected in the emitter-collector paths thereof in parallel with each other and respectively connected at the bases thereof to the collectors of said first and second transistors.

11. A pulse generator circuit according to claim 6, wherein said first and second switching means are formed of fifth and sixth transistors connected in the emitter-collector paths thereof in parallel with each other and respectively connected at the bases thereof to the collectors of said first and second transistors.

12. A pulse generator circuit according to claim 2, wherein said first switch comprises a transistor connected at the emitter thereof to said first capacitive means and connected at the collector thereof to said first power source terminal.

13. A pulse generator circuit according to claim 2, wherein said second capacitive means comprises a third transistor connected at the collector thereof to the base of said second transistor and connected at the base and emitter thereof to the emitter of said second transistor.

14. A pulse generator circuit according to claim 13, wherein said second switch comprises a fourth transistor connected at the emitter thereof to said second capacitive means and connected at the collector thereof to said first power source terminal.

15. A pulse generator circuit according to claim 2, wherein said first capacitive means comprises a MOS capacitor, and said first switch and said first transistor each comprises a MOS transistor.

16. A pulse generator circuit according to claim 15, wherein said second capacitive means comprises a MOS capacitor, and said second switch and said second transistor each comprises a MOS transistor.

* * * * *